(12) United States Patent
Andic

(10) Patent No.: US 10,036,454 B1
(45) Date of Patent: Jul. 31, 2018

(54) LOCKING DEVICE FOR METER COVER

(71) Applicant: Eaton Corporation, Cleveland, OH (US)

(72) Inventor: Milorad Andic, Burlington (CA)

(73) Assignee: Eaton Intelligent Power Limited, Dublin (IE)

( * ) Notice: Subject to any disclaimer, the term of this patent is extended or adjusted under 35 U.S.C. 154(b) by 0 days.

(21) Appl. No.: 15/384,407

(22) Filed: Dec. 20, 2016

(51) Int. Cl.
*F16B 2/08* (2006.01)
*F16H 19/04* (2006.01)
*G01R 11/04* (2006.01)
*G01R 11/24* (2006.01)

(52) U.S. Cl.
CPC ............... *F16H 19/04* (2013.01); *F16B 2/08* (2013.01); *G01R 11/04* (2013.01); *G01R 11/24* (2013.01)

(58) Field of Classification Search
CPC . F16H 19/04; F16B 2/08; G01R 11/04; G01R 11/24
See application file for complete search history.

(56) References Cited

U.S. PATENT DOCUMENTS

| | | | | |
|---|---|---|---|---|
| 3,861,180 A * | 1/1975 | Heckrotte, Sr. | ........ | G01R 11/04 215/275 |
| 4,008,585 A * | 2/1977 | Lundberg | ............... | G01R 11/04 24/280 |
| 4,076,291 A * | 2/1978 | Pope | ....................... | H02L 31/06 24/280 |
| 4,121,147 A * | 10/1978 | Becker | ..................... | G01R 1/04 324/104 |
| 4,225,165 A | 9/1980 | Kesselman | | |
| 4,226,102 A * | 10/1980 | Mattress, Jr. | ....... | E05B 65/0089 220/324 |
| 4,329,860 A * | 5/1982 | Moberg | ................ | G01R 11/04 292/256.67 |
| 4,446,603 A | 5/1984 | Guiler | | |
| 4,674,304 A * | 6/1987 | Guiler | ................... | E05B 67/365 292/256.67 |
| 4,793,164 A * | 12/1988 | Sloop, Sr. | ............. | E05B 67/365 70/164 |
| 4,934,747 A * | 6/1990 | Langdon | ................... | F16B 2/08 292/256.67 |
| 5,121,953 A * | 6/1992 | Mahaney | .............. | F16B 41/005 292/256.6 |

(Continued)

*Primary Examiner* — Robert J Sandy
*Assistant Examiner* — David Upchurch
(74) *Attorney, Agent, or Firm* — Benesch Friedlander Coplan & Aronoff LLP

(57) ABSTRACT

An electric meter housing and a cover have adjacent circular flanges reaching circumferentially about a cover axis. A clamping ring has a first end portion, a second end portion, and a cross-section configured for the ring to take an installed position fitted radially over the adjacent circular flanges. A gear moves the first end portion of the clamping ring circumferentially relative to the second end portion upon rotation of the gear. A manual actuator rotates the gear upon rotation of the actuator about an axis that is parallel or substantially parallel to the cover axis when the clamping ring is in the installed position. The gear is movable axially into and out of a blocked position in which a stop member blocks rotation of the gear. The actuator is interconnected with the gear to move the gear rotationally and axially relative to the stop member.

20 Claims, 4 Drawing Sheets

(56) References Cited

U.S. PATENT DOCUMENTS

| | | | | |
|---|---|---|---|---|
| 5,851,038 A | * | 12/1998 | Robinson | F16L 23/08 |
| | | | | 24/279 |
| 6,032,989 A | * | 3/2000 | DeWalch | B65D 45/32 |
| | | | | 292/256.6 |
| 7,500,701 B2 | * | 3/2009 | Lalancette | F16B 5/0275 |
| | | | | 292/256 |
| 7,650,767 B2 | * | 1/2010 | Robinson | G01R 11/04 |
| | | | | 292/256.6 |
| 2006/0277955 A1 | * | 12/2006 | Debrody | E05B 65/0089 |
| | | | | 70/164 |

* cited by examiner

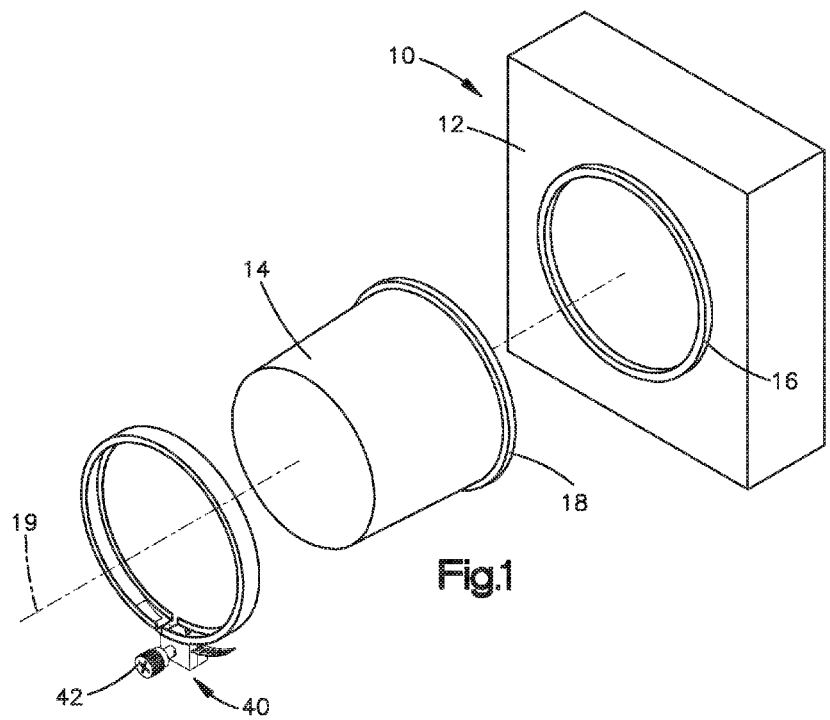
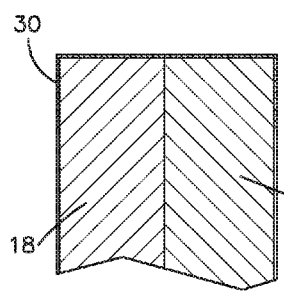
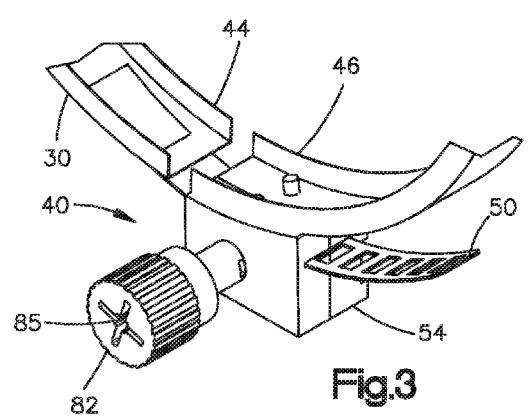

LOCKING DEVICE FOR METER COVER

TECHNICAL FIELD

This technology relates to device for locking a cover on an electric meter.

BACKGROUND

An electric meter is typically contained in a meter housing with a cylindrical cover. The meter housing and the cover have adjacent circular flanges. A clamping ring with a U-shaped cross-section is fitted radially over the adjacent flanges, and is secured by a locking device.

SUMMARY

An apparatus is configured for use with a cover for an electric meter housing. The cover and the meter housing have adjacent circular flanges reaching circumferentially about a cover axis. The apparatus includes a clamping ring having a first end portion, a second end portion, and a cross-section configured for the ring to take an installed position fitted radially over the adjacent circular flanges. The apparatus further includes a gear mechanism in which a gear moves the first end portion of the clamping ring circumferentially relative to the second end portion upon rotation of the gear. In an embodiment described as an example, a manual actuator rotates the gear upon rotation of the actuator about an axis that is parallel or substantially parallel to the cover axis when the ring is in the installed position.

In the given example, the gear mechanism includes a stop member, and the gear is movable axially into and out of a blocked position in which the stop member blocks rotation of the gear. The actuator is interconnected with the gear to move the gear rotationally and axially relative to the stop member.

The given example further includes a gear housing that is mounted on the second end portion of the ring for movement with the second portion relative to the first portion. The gear is a pinion supported for rotation within the gear housing. A rack projects longitudinally from the first end portion of the ring into and through the gear housing in meshing engagement with the pinion.

BRIEF DESCRIPTION OF THE DRAWINGS

FIG. 1 is a perspective view showing an electric meter, a cover for the meter, a clamping ring, and a device for locking the clamping ring.

FIG. 2 is a partial sectional view showing parts of the meter, cover, and clamping ring.

FIG. 3 is an enlarged partial view of the locking device of FIG. 1.

DETAILED DESCRIPTION

Figure 4:
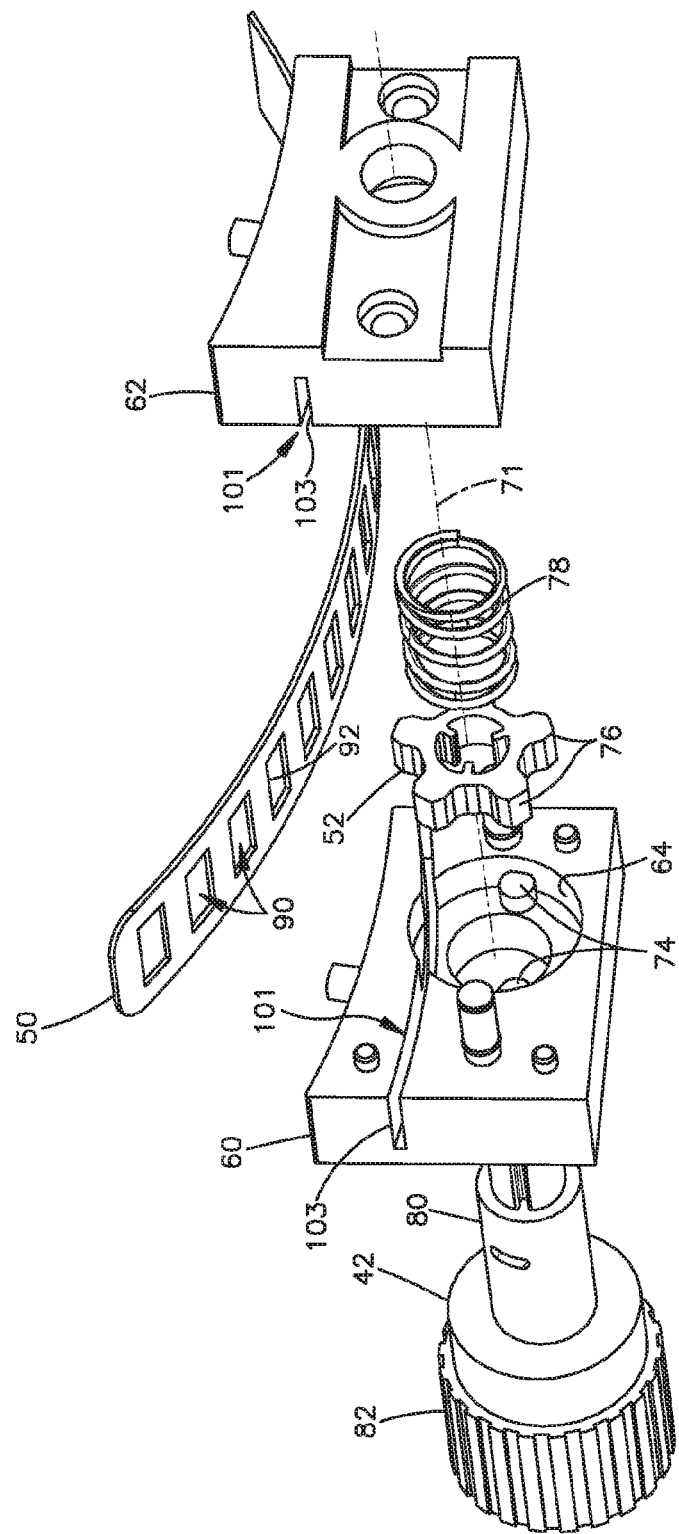
FIG. 4 is an exploded perspective view of parts of the locking device.

The structures illustrated in the drawings include examples of the elements recited in the claims. The illustrated structures thus include examples of how a person of ordinary skill in the art can make and use the claimed invention. These examples are described to meet the enablement and best mode requirements of the patent statute without imposing limitations that are not recited in the claims. Elements of one embodiment may be used in combination with, or as substitutes for, elements of another as needed for any particular implementation of the invention.

As shown in FIG. 1, an electric meter 10 has a housing 12 and a cover 14 with circular mounting flanges 16 and 18 centered on an axis 19. A circular clamping ring 30 has a U-shaped cross-section that fits radially over the mounting flanges 16 and 18 to hold them together in axially adjacent positions, as shown for example in FIG. 2. A locking device 40 is manually operable to secure the clamping ring 30 in place on the flanges 16 and 18, and thereby to secure and seal the cover 14 on the housing 12. A manual actuator 42 projects forward at the front of the locking device 40.

The clamping ring 30 has first and second end portions 44 and 46. The locking device 40 includes a gear mechanism that operates to move the first end portion 44 of the ring 30 circumferentially relative to the second end portion 46 for tightening and loosening of the ring 30 on the mounting flanges 16 and 18. In this embodiment the gear mechanism includes a rack 50 (FIG. 3) that is fixed to the first end portion 44 of the ring 30 to move with the first end portion 44 relative to the second end portion 46. The gear mechanism further includes a pinion 52 (FIG. 4) inside a gear housing 54. The gear housing 54 is fixed to the second end portion 46 of the ring 30 for movement with the second end portion 46 relative to the first end portion 44.

Figure 5:
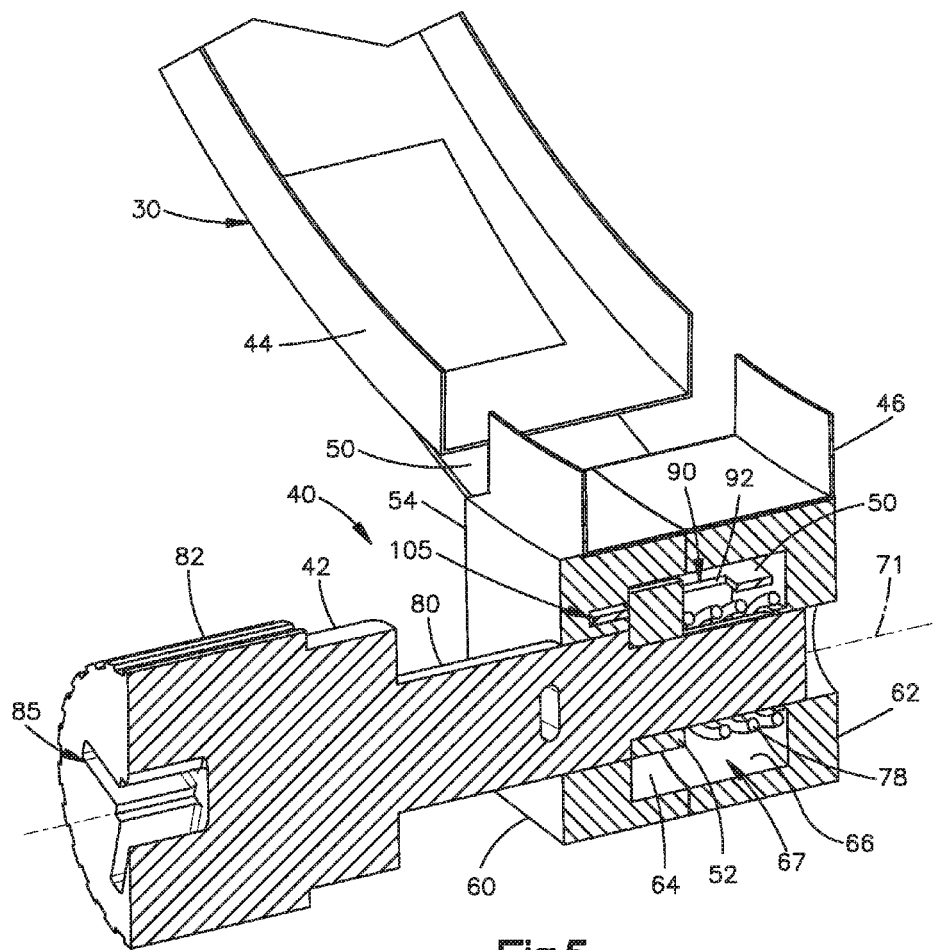
FIG. 5 is a perspective view showing other parts of the locking device.

As best shown in FIG. 5, front and rear parts 60 and 62 of the gear housing 54 have annular inner surfaces 64 and 66 that together define a cylindrical compartment 67 in which the pinion 52 is contained. The pinion 52 is rotatable about a pinion axis 71 within the compartment 67. The pinion 52 is also movable along the pinion axis 71 within the compartment 67. Specifically, the pinion 52 has a blocked position in which stop members 74 (FIG. 4) on the front housing part 60 are interposed between gear teeth 76 on the pinion 52 to block rotation of the pinion 52. When the pinion 52 is moved axially rearward to a position spaced from the stop members 74, it is then free to rotate about the axis 71. A spring 78 is compressed axially between the pinion 52 and the rear housing part 62 to bias the pinion 52 toward and into the blocked position.

A shaft portion 80 of the actuator 42 reaches into and through the gear housing 54 along the pinion axis 71. The pinion 52 is received over the shaft 80, and is fixed to the shaft 80 in a splined connection so that a user can move the pinion rotationally and axially under the influence of a knob 82 on the outer end of the actuator 42. A slot 85 may be provided in the knob 82 for actuation by a key or other tool.

In the illustrated embodiment, the rack 50 is a metal strip that is fixed to the first end portion 44 of the clamping ring 30, and projects circumferentially from the first end portion 44. A row of slots 90 extends along the length of the rack 50. The slots 90 have edges 92 defining gear teeth for meshing with the gear teeth 76 on the pinion 52. Each slot 90 also has a length reaching across the rack 50 sufficiently to provide clearance for a gear tooth 76 on the pinion 52 to move axially back and forth in the slot 90 upon moving axially into and out of the blocked position.

As further shown in FIG. 4, the front and rear parts 60 and 62 of the gear housing 54 have opposed recesses 101 with open opposite ends 103. The recesses 101 together define a passage 105 in which the rack 50 extends into and through the housing 54. The passage 105 extends across the compartment 67 as shown in FIG. 4 so that the rack 50 can mesh with the pinion 52 in the compartment 67 as shown in FIG. 5.

In use, the actuator 42 is pushed inward against the bias of the spring 78 to move the pinion 52 out of the blocked position. The rack 50 is then inserted into and through the gear housing 54 to establish meshing engagement with the pinion 52. The clamping ring 30 can then be placed over the adjacent mounting flanges 16 and 18 on the meter 12 and cover 14 as shown in FIGS. 1 and 2. In that arrangement, the pinion axis 71 is parallel or substantially parallel with the cover axis 19 so that the knob 82 is easily accessible at the front of the cover 14. The ring 30 can then be tightened as needed by rotating the knob 82 while holding the actuator 42 and the pinion 52 inward against the bias of the spring 78.

Figure 6:
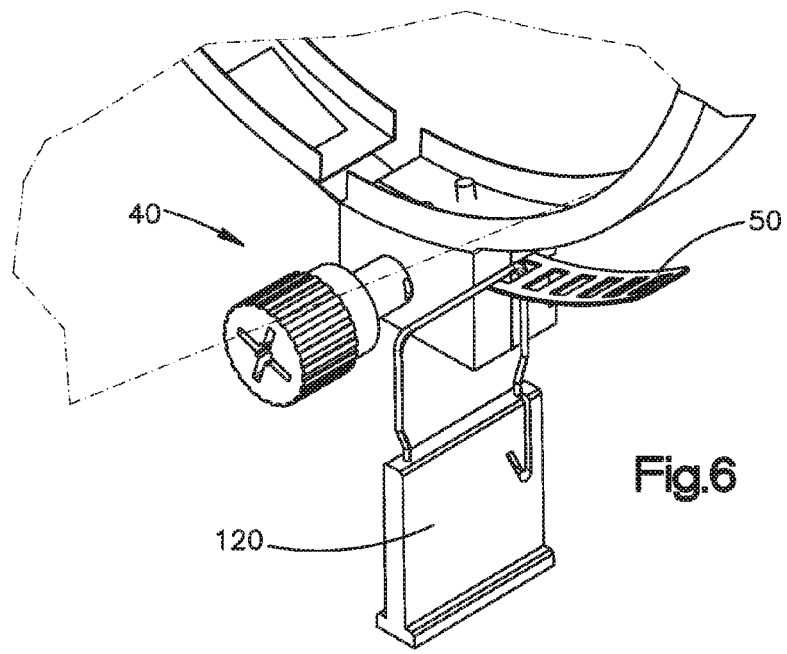
FIGS. 6 and 7 are views similar to FIG. 3 showing an additional lock.
Figure 7:
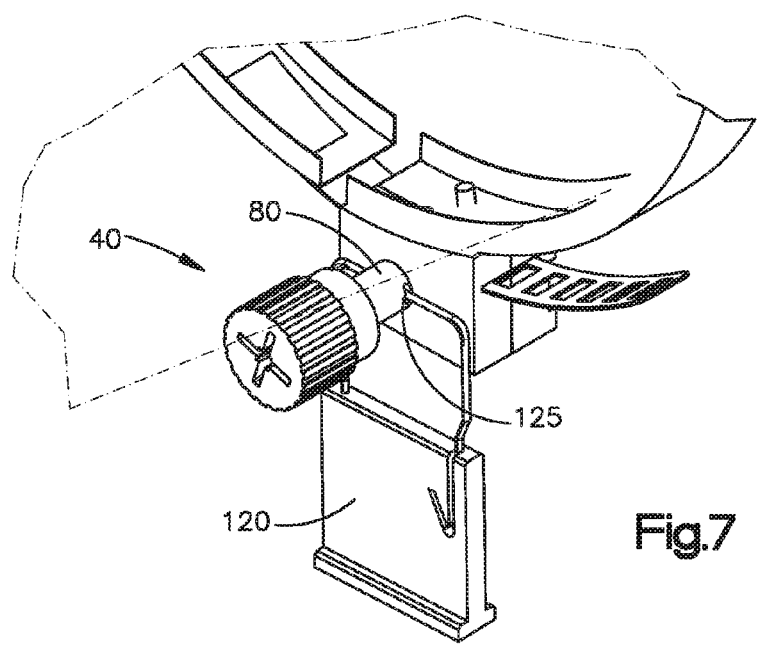

As further shown in FIGS. 6 and 7, an additional lock 120 may be installed through a slot 90 in the rack 50 or an aperture 125 through the actuator shaft 80.

This written description sets forth the best mode of carrying out the invention, and describes the invention so as to enable a person skilled in the art to make and use the invention, by presenting examples of the elements recited in the claims. The patentable scope of the invention is defined by the claims, and may include other examples that do not differ from the literal language of the claims, as well as equivalent examples with insubstantial differences from the literal language of the claims.

What is claimed is:

1. An apparatus for use with an electric meter housing and a cover having adjacent circular flanges reaching circumferentially about a cover axis, the apparatus comprising:
    a clamping ring having a first end portion, a second end portion, and a cross-section configured for the ring to take an installed position fitted radially over the adjacent circular flanges; and
    a gear mechanism including a gear configured to move the first end portion of the ring circumferentially relative to the second end portion upon rotation of the gear; and
    a manual actuator configured to rotate the gear upon rotation of the actuator about an axis parallel or substantially parallel to the cover axis when the ring is in the installed position.

2. An apparatus as defined in claim 1 wherein the gear is a pinion, and the gear mechanism further includes a rack comprising a slotted strip projecting longitudinally from the first end portion of the ring.

3. An apparatus as defined in claim 1 wherein the gear mechanism includes a rack, and the gear is a pinion supported on the second end portion of the ring for movement with the second end portion relative to the first end portion.

4. An apparatus as defined in claim 3 further comprising a gear housing mounted on the second end portion of the ring for movement with the second end portion relative to the first end portion, and wherein the pinion is supported for rotation within the gear housing.

5. An apparatus as defined in claim 4 wherein the rack and the gear housing are configured for the rack to project longitudinally from the first end portion of the ring into and through the gear housing in meshing engagement with the pinion.

6. An apparatus as defined in claim 5 wherein the rack comprises a slotted strip, and further comprising a lock member received through a slot in the strip at a location outside the gear housing.

7. An apparatus as defined in claim 1 further comprising a stop member, and wherein the gear is supported for movement axially into and out of a blocked position in which the stop member blocks rotation of the gear.

8. An apparatus as defined in claim 7 wherein the gear and the actuator are interconnected for movement together rotationally and axially relative to the stop member.

9. An apparatus as defined in claim 7 wherein the gear mechanism includes a rack with a slot, the gear is a pinion with a tooth projecting radially through the slot, and the tooth is movable axially within the slot upon movement of the pinion into and out of the blocked position.

10. An apparatus as defined in claim 7 further comprising a spring biasing the pinion toward the blocked position.

11. An apparatus for use with an electric meter housing and a cover having adjacent circular flanges, the apparatus comprising:
    a clamping ring having a first end portion, a second end portion, and a cross-section configured to fit radially over the adjacent circular flanges; and
    a gear mechanism including a gear configured to move the first end portion of the ring circumferentially relative to the second end portion upon rotation of the gear about a gear axis, and further including a stop member, wherein the gear is movable axially into and out of a blocked position in which the stop member blocks rotation of the gear about the gear axis.

12. An apparatus as defined in claim 11 further comprising a manual actuator, and wherein the gear and the actuator are interconnected for movement together rotationally and axially relative to the stop member.

13. An apparatus as defined in claim 11 wherein the gear mechanism includes a rack with a slot, the gear is a pinion with a tooth projecting radially through the slot, and the tooth is movable axially within the slot upon movement of the pinion into and out of the blocked position.

14. An apparatus as defined in claim 11 further comprising a spring biasing the gear toward the blocked position.

15. An apparatus for use with an electric meter housing and a cover having adjacent circular flanges, the apparatus comprising:
    a clamping ring having a first end portion, a second end portion, and a cross-section configured to fit radially over the adjacent circular flanges;
    a gear housing mounted on the second end portion of the ring for movement with the second end portion relative to the end first portion; and
    a gear mechanism including a rack and pinion configured to move the first end portion of the ring circumferentially relative to the second end portion upon rotation of the pinion;
        wherein the pinion is supported for rotation within the gear housing; and
        the rack is configured to project longitudinally from the first end portion of the ring into and through the gear housing in meshing engagement with the pinion.

16. An apparatus as defined in claim 15 further comprising a stop member, and wherein the pinion is movable axially into and out of a blocked position in which the stop member blocks rotation of the pinion.

17. An apparatus as defined in claim 16 further comprising a manual actuator, and wherein the pinion and actuator are interconnected for movement together rotationally and axially relative to the stop member.

18. An apparatus as defined in claim 16 wherein the rack has a slot, the pinion has a tooth projecting radially through the slot, and the tooth is movable axially within the slot upon movement of the pinion into and out of the blocked position.

19. An apparatus as defined in claim 16 further comprising a spring biasing the pinion toward the blocked position.

20. An apparatus as defined in claim 15 wherein the rack comprises a slotted strip, and further comprising a lock received through a slot in the strip at a location outside the gear housing.

* * * * *